United States Patent
Baik et al.

(10) Patent No.: US 12,048,218 B2
(45) Date of Patent: Jul. 23, 2024

(54) ELECTROLUMINESCENT DISPLAY DEVICE COMPRISING TRENCHES BETWEEN ADJACENT SUBPIXELS

(71) Applicant: LG DISPLAY CO., LTD., Seoul (KR)

(72) Inventors: Seungmin Baik, Paju-si (KR); Changhwa Jun, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 142 days.

(21) Appl. No.: 17/551,837

(22) Filed: Dec. 15, 2021

(65) Prior Publication Data

US 2022/0199709 A1    Jun. 23, 2022

(30) Foreign Application Priority Data

Dec. 22, 2020   (KR) .......................... 10-2020-0180790

(51) Int. Cl.
*H10K 59/35*   (2023.01)
*H10K 50/15*   (2023.01)
*H10K 50/856*   (2023.01)
*H10K 50/858*   (2023.01)

(52) U.S. Cl.
CPC ......... *H10K 59/353* (2023.02); *H10K 50/156* (2023.02); *H10K 50/856* (2023.02); *H10K 50/858* (2023.02)

(58) Field of Classification Search
None
See application file for complete search history.

(56) References Cited

U.S. PATENT DOCUMENTS

| | | | |
|---|---|---|---|
| 2019/0181368 A1* | 6/2019 | Kim ........................ | H10K 50/19 |
| 2020/0135818 A1* | 4/2020 | Kim ..................... | H10K 59/122 |
| 2020/0144342 A1* | 5/2020 | Shim .................... | H10K 50/813 |

* cited by examiner

Primary Examiner — Daniel Whalen
(74) Attorney, Agent, or Firm — POLSINELLI PC (57) ABSTRACT

An electroluminescent display device includes a substrate having a first subpixel and a second subpixel, which are adjacent to each other, a first electrode provided in each of the first subpixel and the second subpixel on the substrate, a trench including a first trench and a second trench, which are provided to be spaced apart from each other at a boundary between the first subpixel and the second subpixel on the substrate, a light emitting layer provided on the first electrode and provided in the first subpixel, the second subpixel and a boundary between the first subpixel and the second subpixel, and a second electrode provided on the light emitting layer, wherein a first portion of the light emitting layer is discontinuous in the first trench and the second trench, a second portion of the light emitting layer is discontinuous in the first trench and is continuous in an area overlapped with the second trench, and a third portion of the light emitting layer is continuous in an area overlapping with the first trench and the second trench.

20 Claims, 9 Drawing Sheets

ELECTROLUMINESCENT DISPLAY DEVICE COMPRISING TRENCHES BETWEEN ADJACENT SUBPIXELS

CROSS-REFERENCE TO RELATED APPLICATION

This application claims the priority of Korean Patent Application No. 10-2020-0180790 filed on Dec. 22, 2020, which is hereby incorporated by reference in its entirety as if fully set forth herein.

BACKGROUND

Field of the Disclosure

The present disclosure relates to an electroluminescent display device.

Description of the Background

An electroluminescent display device has a structure in which a light emitting layer is formed between an anode electrode and a cathode electrode, and is a device for displaying an image by allowing the light emitting layer to emit light through an electric field between the two electrodes.

The light emitting layer may be made of an organic material for emitting light by transiting exciton generated by combination of electrons and holes from an excited state to a ground state, or may be made of an inorganic material such as quantum dot.

The light emitting layer may be provided to emit light of respective colors different per subpixel, for example, red light, green light and blue light per subpixel, or may be provided to emit light of the same color per subpixel, for example, white light.

In order to obtain an electroluminescent display device of high resolution, subpixels should be formed at a compact interval, and in this case, a leakage current occurs in a boundary area between adjacent subpixels, whereby a problem occurs in that image quality is deteriorated.

SUMMARY

The present disclosure has been made in view of the above problems and is to provide an electroluminescent display device that can prevent a leakage current from occurring in a boundary area between adjacent subpixels and reducing deterioration of image quality due to the leakage current.

In addition, the present disclosure as mentioned above, additional features of the present disclosure will be clearly understood by those skilled in the art from the following description of the present disclosure.

In accordance with an aspect of the present disclosure, an electroluminescent display device comprising a substrate having a first subpixel and a second subpixel, which are adjacent to each other, a first electrode provided in each of the first subpixel and the second subpixel on the substrate, a trench including a first trench and a second trench, which are provided to be spaced apart from each other at a boundary between the first subpixel and the second subpixel on the substrate, a light emitting layer provided on the first electrode and provided in the first subpixel, the second subpixel and a boundary between the first subpixel and the second subpixel, and a second electrode provided on the light emitting layer, wherein a first portion of the light emitting layer is discontinuous in the first trench and the second trench, a second portion of the light emitting layer is discontinuous in the first trench and is continuous in an area overlapped with the second trench, and a third portion of the light emitting layer is continuous in an area overlapped with the first trench and the second trench.

In accordance with another aspect of the present disclosure, an electroluminescent display device comprising a substrate having a first subpixel, a second subpixel and a third subpixel, which are arranged in a first direction, a first electrode provided in each of the first subpixel, the second subpixel and the third subpixel on the substrate, a trench including a first trench and a second trench, which are respectively provided in a boundary area between the first subpixel and the second subpixel and a boundary area between the second subpixel and the third subpixel, a light emitting layer provided on the first electrode and provided in the trench, and a second electrode provided on the light emitting layer, wherein a portion of the light emitting layer is discontinuous in the first trench and the second trench, and a portion of the light emitting layer, which is discontinuous in the first trench, is thicker than a portion of the light emitting layer, which is discontinuous in the second trench.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of the present disclosure will be described in detail with the accompanying drawings.

Figure 1:
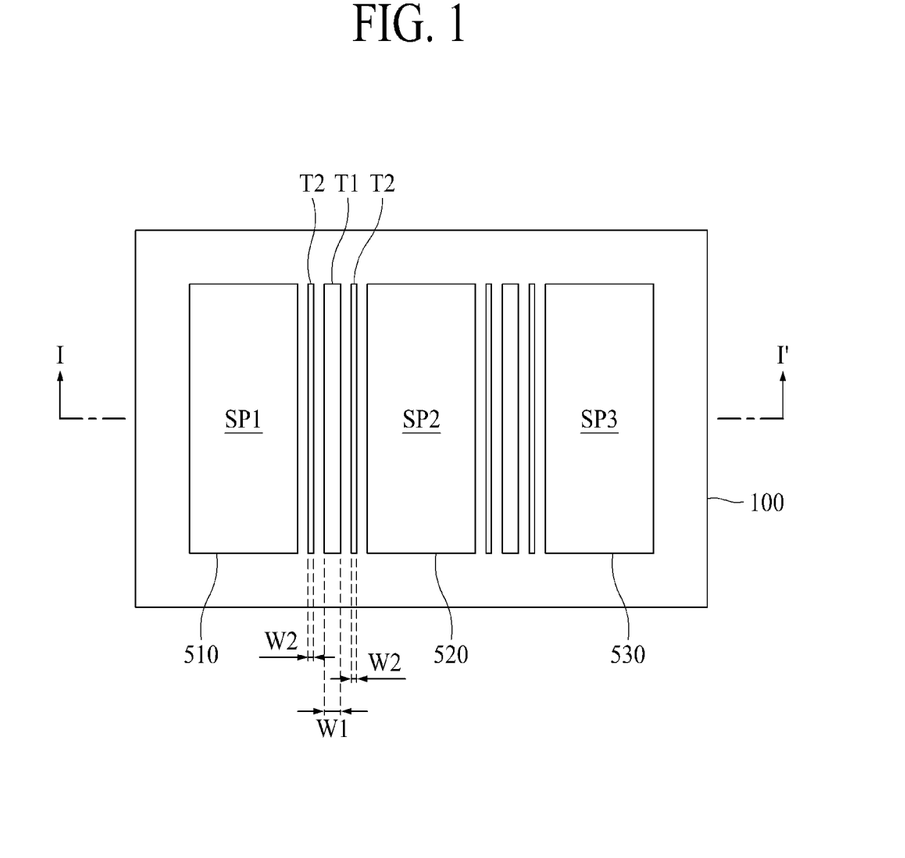
FIG. 1 is a schematic plan view illustrating an electroluminescent display device according to one aspect of the present disclosure.

FIG. 1 is a schematic plan view illustrating an electroluminescent display device according to one aspect of the present disclosure.

As shown in FIG. 1, the electroluminescent display device according to one aspect of the present disclosure includes a substrate 100, first electrodes 510, 520 and 530, and trenches T1 and T2.

A plurality of subpixels SP1, SP2 and SP3 are formed on the substrate 100.

The plurality of subpixels SP1, SP2 and SP3 may include, but are not limited to, a first subpixel SP1, a second subpixel SP2 and a third subpixel SP3, which are arranged in a first direction, for example, in a horizontal direction.

The first subpixel SP1 may be provided to emit light of a first color, for example, red light, the second subpixel SP2 may be provided to emit light of a second color, for example, green light, and the third subpixel SP3 may be provided to emit light of a third color, for example, blue light, but these subpixels are not limited thereto. The arrangement structure of the plurality of subpixels SP1, SP2 and SP3 may be changed to various structures known in the art.

The first electrodes 510, 520 and 530 are formed to be patterned in the first to third subpixels SP1, SP2 and SP3, respectively. That is, one first electrode 510 is formed in the first subpixel SP1, another first electrode 520 is formed in the second subpixel SP2, and the other first electrode 530 is formed in the third subpixel SP3.

The first electrodes 510, 520 and 530 may serve as anodes in the first to third subpixels SP1, SP2 and SP3, and are electrically connected to a source electrode or a drain electrode of a driving thin film transistor formed to be patterned in each of the first to third subpixels SP1, SP2 and SP3.

The trenches T1 and T2 are formed in boundary areas among the plurality of subpixels SP1, SP2 and SP3. In detail, the trenches T1 and T2 are formed in the boundary area between the first subpixel SP1 and the second subpixel SP2 and the boundary area between the second subpixel SP2 and the third subpixel SP3.

The trenches T1 and T2 serve to prevent a leakage current between adjacent subpixels SP1, SP2 and SP3. The subpixels SP1, SP2 and SP3 are provided at compact intervals to embody high resolution. In this case, when light is emitted from the light emitting layer in one of the subpixels SP1, SP2 and SP3, charges in the corresponding light emitting layer move to the light emitting layer in another adjacent one of the subpixels SP1, SP2 and SP3, whereby a leakage current may occur.

In one aspect of the present disclosure, as the trenches T1 and T2 are formed at the boundaries among the subpixels SP1, SP2 and SP3, a portion of the light emitting layer in one of the subpixel SP1, SP2 and SP3 and a portion of the light emitting layer in another adjacent one of the subpixels SP1, SP2 and SP3 can be disconnected from one another in the trenches T1 and T2, whereby a leakage current can be prevented between the adjacent subpixels SP1, SP2 and SP3.

The trenches T1 and T2 may include a first trench T1 and a second trench T2.

The first trench T1 is provided to have a first width w1, and is formed in an area between the first electrode 510 of the first subpixel SP1 and the first electrode 520 of the second subpixel SP2 and an area between the first electrode 520 of the second subpixel SP2 and the first electrode 530 of the third subpixel SP3, respectively.

The second trench T2 is provided to have a second width w2, and may be provided on left and right sides of the first trench T1. In detail, the second trench T2 may be formed in an area between the first electrode 510 of the first subpixel SP1 and the first trench T1 and an area between the first trench T1 and the first electrode 520 of the second subpixel SP2. Also, the second trench T2 may be formed in an area between the first electrode 520 of the second subpixel SP2 and the first trench T1 and an area between the first trench T1 and the first electrode 530 of the third subpixel SP3. As the case may be, the second trench T2 may be formed only on one of the left side and the right side of the first trench T1.

At this time, the first width w1 of the first trench T1 is wider than the second width w2 of the second trench T2. Therefore, a portion of the light emitting layer disconnected in the first trench T1 and a portion of the light emitting layer disconnected in the second trench T2 are different from each other, and this case will be described later.

Figure 2:
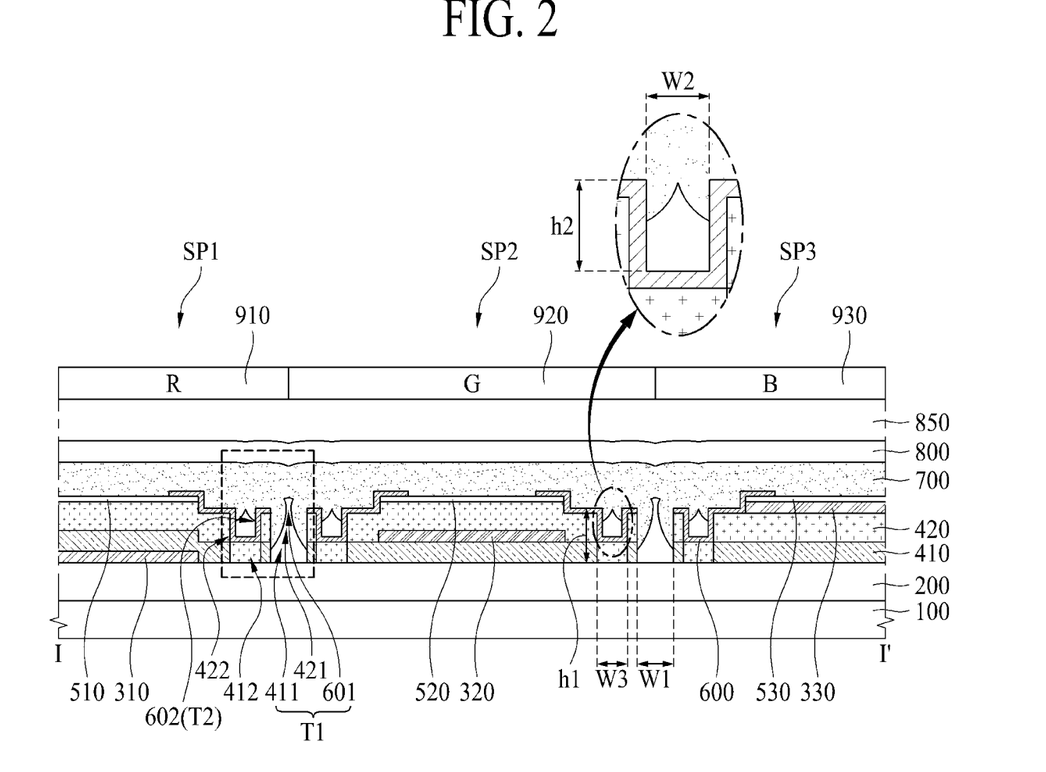
FIG. 2 is a schematic cross-sectional view illustrating an electroluminescent display device according to one aspect of the present disclosure, taken along line I-I' of FIG. 1.

FIG. 2 is a schematic cross-sectional view illustrating an electroluminescent display device according to one aspect of the present disclosure, taken along line I-I' of FIG. 1.

As noted from FIG. 2, the electroluminescent display device according to one aspect of the present disclosure includes a substrate 100, a circuit element layer 200, reflective layers 310, 320 and 330, insulating layers 410 and 420, first electrodes 510, 520 and 530, a fence structure 600, a light emitting layer 700, a second electrode 800, an encapsulation layer 850 and color filter layers 910, 920 and 930.

The substrate 100 may be made of glass or plastic, but is not limited thereto. The substrate 100 may be made of a semiconductor material such as a silicon wafer. A first subpixel SP1, a second subpixel SP2 and a third subpixel SP3 are provided on the substrate 100. The first subpixel SP1 may be provided to emit red (R) light, the second subpixel SP2 may be provided to emit green (G) light, and the third subpixel SP3 may be provided to emit blue (B) light, but these subpixels are not limited thereto.

The electroluminescent display device according to one aspect of the present disclosure may be provided in a top emission type in which emitted light is emitted to an upper side, and thus an opaque material as well as a transparent material may be used as a material of the substrate 100.

The circuit element layer 200 is formed on the substrate 100.

The circuit element layer 200 includes a circuit element that includes various signal lines, a thin film transistor and a capacitor, wherein the circuit element is provided for each of the subpixels SP1, SP2 and SP3. The signal lines may include a gate line, a data line, a power line and a reference line, and the thin film transistor may include a switching thin film transistor, a driving thin film transistor and a sensing thin film transistor.

The switching thin film transistor is switched in accordance with a gate signal supplied to the gate line to supply a data voltage supplied from the data line to the driving thin film transistor.

The driving thin film transistor is switched in accordance with the data voltage supplied from the switching thin film transistor to generate a data current from a power source supplied from the power line and supply the data current to the first electrodes 510, 520 and 530.

The sensing thin film transistor serves to sense a threshold voltage deviation of the driving thin film transistor, which causes degradation of image quality, and supplies the current of the driving thin film transistor to the reference line in response to a sensing control signal supplied from the gate line or a separate sensing line.

The capacitor serves to maintain a data voltage supplied to the driving thin film transistor for one frame, and is connected to each of a gate terminal and a source terminal of the driving thin film transistor.

Each of the switching thin film transistor, the driving thin film transistor and the sensing thin film transistor may be changed to various structures known in the art, such as a bottom gate structure or a top gate structure. The circuit element layer 200 may further include a passivation layer for protecting the switching thin film transistor, the driving thin film transistor and the sensing thin film transistor, and a planarization layer provided on the passivation layer.

The reflective layers 310, 320 and 330 are formed to be patterned on the circuit element layer 200 for each of the subpixels SP1, SP2 and SP3. In detail, the first reflective layer 310 is formed to be patterned in the first subpixel SP1, the second reflective layer 320 is formed to be patterned in the second subpixel SP2, and the third reflective layer 330 is formed to be patterned in the third subpixel SP3.

The reflective layers 310, 320 and 330 are provided so that micro cavity characteristics may be embodied in each of the subpixels SP1, SP2 and SP3. Therefore, a distance from the first reflective layer 310 to the second electrode 800 may be longer than a distance from the second reflective layer 320 to the second electrode 800, and the distance from the second reflective layer 320 to the second electrode 800 may be longer than a distance from the third reflective layer 330 to the second electrode 800. To this end, the first reflective layer 310 may be formed on an upper surface of the circuit element layer 200, the second reflective layer 320 may be formed on an upper surface of the first insulating layer 410, and the third reflective layer 330 may be formed on an upper surface of the second insulating layer 420.

The first reflective layer 310 may electrically be insulated from the first electrode 510 of the first subpixel SP1, but may electrically be connected with the first electrode 510 of the first subpixel SP1 through a contact hole provided in the insulating layers 410 and 420. The second reflective layer 320 may electrically be insulated from the first electrode 520 of the second subpixel SP2, but may electrically be connected with the first electrode 520 of the second subpixel SP2 through a contact hole provided in the second insulating layer 420. Although the third reflective layer 330 may be provided to be in contact with a lower surface of the first electrode 530 of the third subpixel SP3, an insulating layer may be provided between the third reflective layer 330 and the first electrode 530 of the third subpixel SP3 as the case may be.

The insulating layers 410 and 420 include a first insulating layer 410 provided on the circuit element layer 200 and a second insulating layer 420 disposed on the first insulating layer 410.

The first insulating layer 410 includes a first hole 411 and a second hole 412. The first hole 411 and the second hole 412 of the first insulating layer 410 may be provided in a boundary area between the first subpixel SP1 and the second subpixel SP2 and provided to pass through the first insulating layer 410, but is not limited thereto.

The first hole 411 of the first insulating layer 410 is provided between the first electrode 510 of the first subpixel SP1 and the first electrode 520 of the second subpixel SP2 and between the first electrode 520 of the second subpixel SP2 and the first electrode 530 of the third subpixel SP3, respectively. A width w1 of the first hole 411 of the first insulating layer 410 may be the same as the first width w1 of the first trench T1.

The second hole 412 of the first insulating layer 410 may respectively be provided on left and right sides of the first hole 411 of the first insulating layer 410. In detail, the second hole 412 of the first insulating layer 410 is disposed in an area between the first electrode 510 of the first subpixel SP1 and the first hole 411 of the first insulating layer 410 and an area between the first hole 411 of the first insulating layer 410 and the first electrode 520 of the second subpixel SP2. In addition, the second hole 412 of the first insulating layer 410 is disposed in an area between the first electrode 520 of the second subpixel SP2 and the first hole 411 of the first insulating layer 410 and an area between the first hole 411 of the first insulating layer 410 and the first electrode 530 of the third subpixel SP3.

A width W3 of the second hole 412 of the first insulating layer 410 may be the same as the width w1 of the first hole 411 of the first insulating layer 410, but may be different from the width w1 of the first hole 411 of the first insulating layer 410 as the case may be.

The second insulating layer 420 includes a first hole 421 and a second hole 422. The first hole 421 and the second hole 422 of the second insulating layer 420 are provided in a boundary area between the first subpixel SP1 and the second subpixel SP2.

The first hole 421 of the second insulating layer 420 passes through the second insulating layer 420, and is provided to be communicated with the first hole 411 of the first insulating layer 410 while being overlapped with the first hole 411 of the first insulating layer 410. The width w1 of the first hole 421 of the second insulating layer 420 may be the same as the width w1 of the first hole 411 of the first insulating layer 410.

The second hole 422 of the second insulating layer 420 is formed without passing through the second insulating layer 420. The second hole 422 of the second insulating layer 420 overlaps the second hole 412 of the first insulating layer 410 but is not communicated with the second hole 412 of the first insulating layer 410. As the second insulating layer 420 is filled in the second hole 412 of the first insulating layer 410, the second insulating layer 420 is not formed on the second hole 412 of the first insulating layer 410, and the second hole 422 of the second insulating layer 420 may be formed in a recessed shape. Therefore, a width w3 of the second hole 422 of the second insulating layer 420 may be the same as a width w3 of the third hole 413 of the first insulating layer 410, but is not limited thereto.

The first electrodes 510, 520 and 530 are formed to be patterned on the insulating layers 410 and 420 for each of the subpixels SP1, SP2 and SP3. The first electrodes 510, 520 and 530 may serve as anodes of the electroluminescent display device. The first electrodes 510, 520 and 530 are formed to overlap the reflective layers 310, 320, 330 in the respective subpixels SP1, SP2 and SP3.

Although not shown in detail, the first electrodes 510, 520 and 530 are electrically connected with the source terminal or the drain terminal of the driving thin film transistor provided in the circuit element layer 200 in each of the subpixels SP1, SP2 and SP3. The first electrodes 510, 520 and 530 may electrically be connected with the source terminal or the drain terminal of the driving thin film transistor through the reflective layers 310, 320 and 330 made of a conductive material, and may directly be connected with the source terminal or the drain terminal of the driving thin film transistor.

The fence structure 600 may be provided in boundary areas among the subpixels SP1, SP2 and SP3, and may be formed in a matrix structure in a plan view. The fence structure 600 is formed to cover edges of the first electrodes 510, 520 and 530 on the insulating layers 410 and 420. In detail, the fence structure 600 is formed to cover both ends of the first electrodes 510, 520 and 530, whereby deterioration of light emission efficiency due to a current concentrated on ends of the first electrodes 510, 520 and 530 can be avoided. A portion of the upper surface of the first electrodes 510, 520 and 530, which is exposed without being covered by the fence structure 600, becomes a light emission area.

The fence structure 600 includes a first hole 601 and a second hole 602.

The first hole 601 of the fence structure 600 passes through the fence structure 600, and is provided to be communicated with the first hole 421 of the second insulating layer 420 and the first hole 411 of the first insulating layer 410 while being overlapped with them. A width w1 of the first hole 601 of the fence structure 600 may be the same as the width w1 of the first hole 421 of the second insulating layer 420.

The second hole 602 of the fence structure 600 is formed without passing through the fence structure 600. The second hole 602 of the fence structure 600 overlaps with the second hole 422 of the second insulating layer 420 but is not communicated with the second hole 422 of the second insulating layer 420. Since the fence structure 600 is thin and is formed in the second hole 422 of the second insulating layer 420, the second hole 602 of the fence structure 600 may be obtained with a smaller size than the second hole 422 of the second insulating layer 420 while corresponding to the second hole 422 of the second insulating layer 420. Therefore, a width w2 of the second hole 602 of the fence structure 600 is smaller than the width w3 of the second hole 422 of the second insulating layer 420.

The first and second trenches T1 and T2 are formed in the fence structure 600 and the insulating layers 410 and 420.

The first trench T1 is formed by combination of the first hole 601 of the fence structure 600, the first hole 421 of the second insulating layer 420 and the first hole 411 of the first insulating layer 410, which are overlapped with one another while being communicated with one another. The second trench T2 is comprised of a second hole 602 of the fence structure 600.

Therefore, a depth h1 of the first trench T1 is deeper than a depth h2 of the second trench T2, and a width w1 of the first trench T1 is wider than a width w2 of the second trench T2.

The light emitting layer 700 is formed in the plurality of subpixels SP1, SP2 and SP3 and the boundary areas among the plurality of subpixels SP1, SP2 and SP3. The light emitting layer 700 is formed on the first electrodes 510, 520 and 530 and the fence structure 600, and is also formed on the insulating layers 410 and 420 in the trenches T1 and T2.

The light emitting layer 700 may be provided to emit white light. To this end, the light emitting layer 700 may include a plurality of stacks for emitting light of different colors.

A portion of the light emitting layer 700 is disconnected in the first trench T1 and the second trench T2, and since a size of the first trench T1 is greater than that of the second trench T2, a portion of the light emitting layer 700 disconnected in the first trench T1 is different from a portion of the light emitting layer 700 disconnected in the second trench T2. Particularly, a portion of the light emitting layer 700 disconnected in the first trench T1 is thicker than a portion of the light emitting layer 700 disconnected in the second trench T2, and this case will be described later.

The second electrode 800 is formed on the light emitting layer 700. The second electrode 800 may serve as a cathode of the electroluminescent display device. In the same manner as the light emitting layer 700, the second electrode 800 is formed in the subpixels SP1, SP2 and SP3 and the boundary areas among the subpixels SP1, SP2 and SP3.

Since the electroluminescent display device according to one aspect of the present disclosure is provided in a top emission type, the second electrode 800 may include a transparent conductive material to transmit the light emitted from the light emitting layer 700 to an upper portion. In addition, the second electrode 800 may be made of a semi-transparent electrode, and thus a micro cavity effect may be obtained for each of the subpixels SP1, SP2 and SP3. When the second electrode 800 is made of a semi-transparent electrode, reflection and re-reflection of light are repeated between the second electrode 800 and the reflective layers 310, 320 and 330 to obtain the micro cavity effect, whereby light efficiency may be improved.

The encapsulation layer 850 is formed on the second electrode 800 to prevent external moisture from being permeated into the light emitting layer 700. The encapsulation layer 850 may be made of an inorganic insulating material, or may be made of an inorganic insulating material and an organic insulating material, which are alternately deposited, but is not limited thereto.

The color filter layers 910, 920 and 930 are formed on the encapsulation layer 850. The color filter layers 910, 920 and 930 may include, but are not limited to, a red (Y) color filter 910 provided in the first subpixel P1, a green (G) color filter 920 provided in the second subpixel P2 and a blue (B) color filter 930 provided in the third subpixel P3. Although not shown, a black matrix may additionally be formed between the color filter layers 910, 920 and 930 to prevent light from leaking at the boundary areas among the subpixels SP1, SP2 and SP3.

Figure 3:
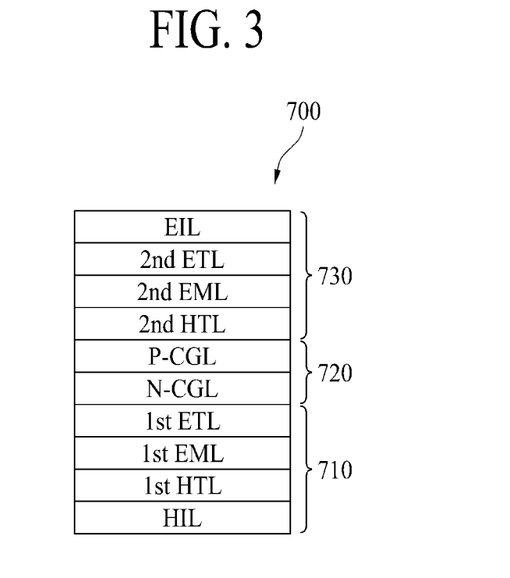
FIG. 3 is a cross-sectional view illustrating a deposited structure of a light emitting layer according to one aspect of the present disclosure.

FIG. 3 is a cross-sectional view illustrating a deposited structure of a light emitting layer according to one aspect of the present disclosure.

As noted from FIG. 3, the light emitting layer 700 according to one aspect of the present disclosure may include a first stack 710, a second stack 730, and a charge generation layer 720 disposed between the first stack 710 and the second stack 730.

The first stack 710 may include, but is not limited to, a hole injection layer HIL, a first hole transport layer (1st HTL) provided on the hole injection layer HIL, a first organic light emitting layer (1st EML) provided on the first hole transport layer (1st HTL) and a first electron transport layer (1st ETL) provided on the first organic light emitting layer (1st EML). The first organic light emitting layer (1st EML) may be formed of a yellow-green light emitting layer or a blue light emitting layer.

The charge generation layer 720 includes an N-type charge generation layer N-CGL provided on the first stack 710 and a P-type charge generation layer P-CGL provided on the N-type charge generation layer N-CGL. The N-type charge generation layer N-CGL provides electrons to the first stack 710, and the P-type charge generation layer P-CGL provides holes to the second stack 730.

The second stack 730 may include, but is not limited to, a second hole transport layer (2nd HTL) provided on the charge generation layer 720, a second organic light emitting layer (2nd EML) provided on the second hole transport layer (2nd HTL), a second electron transport layer (2nd ETL) provided on the second organic light emitting layer (2nd EML), and an electron injection layer EIL provided on the second electron transport layer (2nd ETL). The second organic light emitting layer (2nd EML) may be formed of a blue light emitting layer or a yellow-green light emitting layer.

The hole injection layer HIL of the first stack 710 and the charge generation layer 720 have electrical conductivity relatively higher than the other layers. Therefore, when the hole injection layer HIL is connected among the subpixels SP1, SP2 and SP3 disposed to be adjacent to one another or when the charge generation layer 720 is connected among the subpixels SP1, SP2 and SP3 disposed to be adjacent to one another, a leakage current may occur among the subpixels SP1, SP2 and SP3 disposed to be adjacent to one another through the hole injection layer HIL or the charge generation layer 720.

According to one aspect of the present disclosure, as the hole injection layer HIL is provided to be discontinuous in the trenches T1 and T2, a leakage current may be prevented from occurring between the adjacent subpixels SP1, SP2 and SP3. As the charge generation layer 720 is provided to be discontinuous in the first trench T1, a leakage current may be prevented from occurring between the adjacent subpixels SP1, SP2 and SP3. This case will be described in more detail with reference to FIG. 4.

Figure 4:
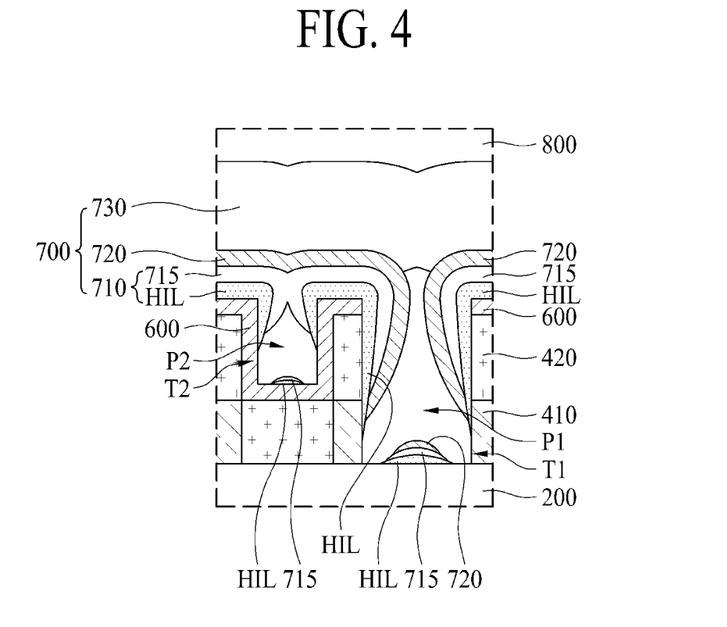
FIG. 4 is a detailed cross-sectional view illustrating a trench area in an electroluminescent display device according to one aspect of the present disclosure.

FIG. 4 is a detailed cross-sectional view illustrating a trench area in an electroluminescent display device according to one aspect of the present disclosure. FIG. 4 more specifically illustrates the light emitting layer 700 in the trench areas T1 and T2 of FIG. 2. In FIG. 4, the same reference numerals are given to the same elements as those of FIG. 2. Hereinafter, the light emitting layer 700 will be described in detail.

As noted from FIG. 4, the light emitting layer 700 includes a first stack 710, a charge generation layer 720 and a second stack 730.

The first stack 710 includes a hole injection layer HIL and an upper layer 715. The upper layer 715 includes a plurality of layers, which are deposited on the hole injection layer HIL to constitute the first stack 710, as one layer shown for convenience. Therefore, the upper layer 715 may include the first hole transport layer (1st HTL), the first organic light emitting layer (1st EML) and the first electron transport layer (1st ETL) of FIG. 3.

The hole injection layer HIL is discontinuous in the first trench T1 and is also discontinuous in the second trench T2.

Based on a central portion of the first trench T1, the hole injection layer HIL formed on one side inside the first trench T1, e.g., the left side of the first trench T1 and the hole injection layer HIL formed on the other side inside the first trench T1, e.g., the right side of the first trench T1 are disconnected without being connected to each other. In addition, the hole injection layer HIL formed on the lower surface inside the first trench T1 is disconnected without being connected to the hole injection layer HIL formed on one side and the other side inside the first trench T1. Therefore, charges cannot move between the respective subpixels SP1, SP2 and SP3 disposed to be adjacent to each other with the first trench T1 interposed therebetween, through the hole injection layer HIL.

Similarly, based on a central portion of the second trench T2, the hole injection layer HIL formed on one side inside the second trench T2, e.g., the left side of the second trench T2 and the hole injection layer HIL formed on the other side inside the second trench T2, e.g., the right side of the second trench T2 are disconnected without being connected to each other. In addition, the hole injection layer HIL formed on the lower surface inside the second trench T2 is disconnected without being connected to the hole injection layer HIL formed on one side and the other side inside the second trench T2. Therefore, charges cannot move between the respective subpixels SP1, SP2 and SP3 disposed to be adjacent to each other with the second trench T2 interposed therebetween, through the hole injection layer HIL.

The upper layer 715 is discontinuous in the first trench T1 but is continuous in the second trench T2 having a width narrower than that of the first trench T1 and a depth lower than that of the first trench T1.

In detail, based on the central portion of the first trench T1, the upper layer 715 formed on one side inside the first trench T1, the upper layer 715 formed on the other side inside the first trench T1 and the upper layer 715 formed on the lower surface inside the first trench T1 are disconnected without being connected to one another. At this time, on at least one of one side or the other side inside the first trench T1, the upper layer 715 may fail to completely cover the hole injection layer HIL, whereby an end of the hole injection layer HIL may be exposed.

In contrast, based on the central portion of the second trench T2, the upper layer 715 formed on one side of the second trench T2, e.g., the left side of the second trench T2 and the upper layer 715 formed on the other side of the second trench T2, e.g., the right side of the second trench T2 are continuously connected to each other. Meanwhile, the upper layer 715 may be formed on the hole injection layer HIL formed on the lower surface of the second trench T2.

At this time, the upper layer 715 at the central portion of the second trench T2 may be thinner than the upper layer 715 on one side and the other side of the second trench T2. This is because that the upper layer 715 may be formed such that portions of the upper layer 715 are deposited to be spaced apart from each other on one side and the other side of the second trench T2 and then meet each other.

Therefore, at least one layer formed below the upper layer 715, for example, the first hole transport layer (1st HTL) may be discontinuous in the second trench T2 or in an area overlapped with the second trench T2 in the same manner as the hole injection layer HIL. As the case may be, the first hole transport layer (1st HTL) and the first organic light emitting layer (1st EML) may be discontinuous in the second trench T2 or in an area overlapped with the second trench T2.

The charge generation layer 720 is discontinuous in the first trench T1 but is continuous in the second trench T2.

In detail, based on the central portion of the first trench T1, the charge generation layer 720 formed on one side inside the first trench T1, the charge generation layer 720 formed on the other side inside the first trench T1 and the charge generation layer 720 formed on the lower surface of the first trench T1 are disconnected without being connected to each other.

On the other hand, based on the central portion of the second trench T2, the charge generation layer 720 formed on one side of the second trench T2, e.g., the left side of the second trench T2 and the charge generation layer 720 formed on the other side of the second trench T2, e.g., the right side of the second trench T2 are continuously connected to each other.

Meanwhile, on at least one of one side or the other side of the first trench T1, the charge generation layer 720 may be extended to the end of the hole injection layer HIL, which is exposed, while passing by an end of the upper layer 715 of the first stack 710, and then may be connected with the end of the hole injection layer HIL. However, the charge generation layer 720 is not connected with the hole injection layer HIL in the area overlapped with the second trench T2.

Since the charge generation layer 720 and the hole injection layer HIL have excellent electrical conductivity, when the charge generation layer 720 and the hole injection layer HIL are electrically connected, it is difficult to obtain desired light emission in the first organic light emitting layer (1st EML) in the first stack 710. However, according to one aspect of the present disclosure, since the hole injection layer HIL is discontinuous in the second trench T2, even though a short occurs between the charge generation layer 720 and the hole injection layer HIL in the first trench T1, the charge generation layer 720 and the hole injection layer HIL are not connected to each other in each of the subpixels SP1, SP2 and SP3, whereby desired light emission may be obtained in the first organic light emitting layer (1st EML).

The second stack 730 is continuous in the first trench T1 and the second trench T2.

At this time, the second stack 730 at the center portion of the first trench T1 may be thinner than the second stack 730 on one side and the other side of the first trench T1. This is because that the second stack 730 may be formed such that portions of the second stack 730 are deposited to be spaced apart from each other on one side and the other side of the first trench T1 and then meet each other.

Therefore, at least one layer formed below the second stack 730, for example, the second hole transport layer (2nd HTL) may be discontinuous in the first trench T1 or in an area overlapped with the first trench T1 in the same manner as the charge generation layer 720. As the case may be, the second hole transport layer (2nd HTL) and the second organic light emitting layer (2nd EML) may be discontinuous in the second trench T2 or in an area overlapped with the second trench T2.

A first pore P1 is formed in the first trench T1 and a second pare P2 is formed in the second trench T2 by the aforementioned structure of the first stack 710, the charge generation layer 720 and the second stack 720. The first and second pores P1 and P2 may be defined by the circuit element layer 200, the insulating layers 410 and 420 and the light emitting layer 700. A size of the first pore P1 may be greater than that of the second pore P2.

The first pore P1 may be extended from the inside of the first trench T1 to the outside above the first trench T1, and thus the first stack 710 and the charge generation layer 720 may be discontinuous in the first trench T1. In addition, the second pore P2 may be extended from the inside of the second trench T2 to the outside above the second trench T2, and thus the hole injection layer HIL of the first stack 710 may be discontinuous in the first trench T1.

Figure 5:
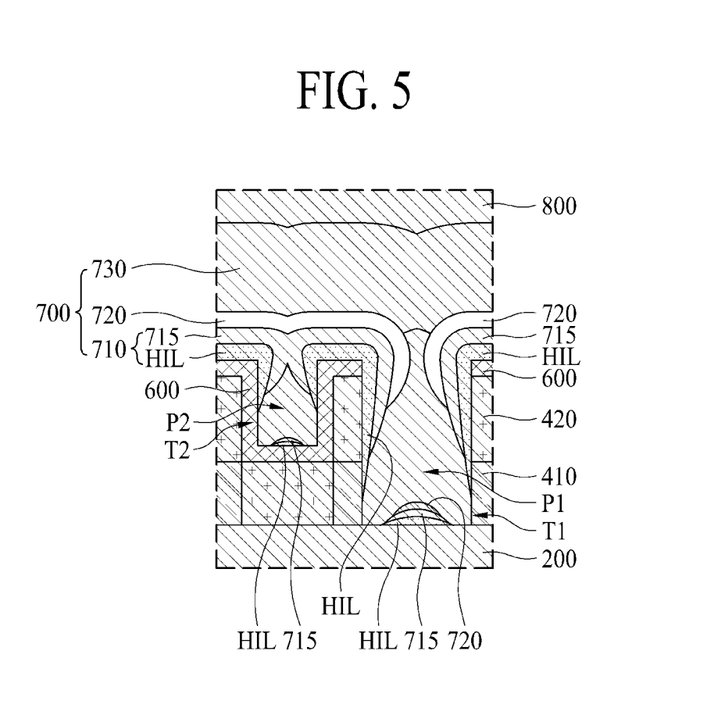
FIG. 5 is a detailed cross-sectional view illustrating a trench area in an electroluminescent display device according to another aspect of the present disclosure.

FIG. 5 is a detailed cross-sectional view illustrating a trench area in an electroluminescent display device according to another aspect of the present disclosure. FIG. 5 is the same as FIG. 4 except that the charge generation layer 720 is not connected with the hole injection layer HIL of the first stack 710. Therefore, the description will be based on the difference from FIG. 4.

Referring to FIG. 4, although the charge generation layer 720 is extended to the end of the hole injection layer HIL in the first trench T1 after passing by the end of the upper layer 715 of the first stack 710. However, referring to FIG. 5, the charge generation layer 720 does not pass by the end of the upper layer 715 of the first stack 710 in the first trench T1, and thus the charge generation layer 720 is not connected to the end of the hole injection layer HIL.

As shown in FIG. 5, since the charge generation layer 720 and the hole injection layer HIL are not electrically connected with each other in the first trench T1, a problem due to a short between the charge generation layer 720 and the hole injection layer HIL does not occur.

FIGS. 6A to 6E are schematic cross-sectional views illustrating a manufacturing process of an electroluminescent display device according to one aspect of the present disclosure, and is a view illustrating a manufacturing process of the electroluminescent display device of FIG. 2. Therefore, the same reference numerals are given to the same elements as those of FIG. 2, and a repeated description of the same elements will be omitted.

Figure 6A:
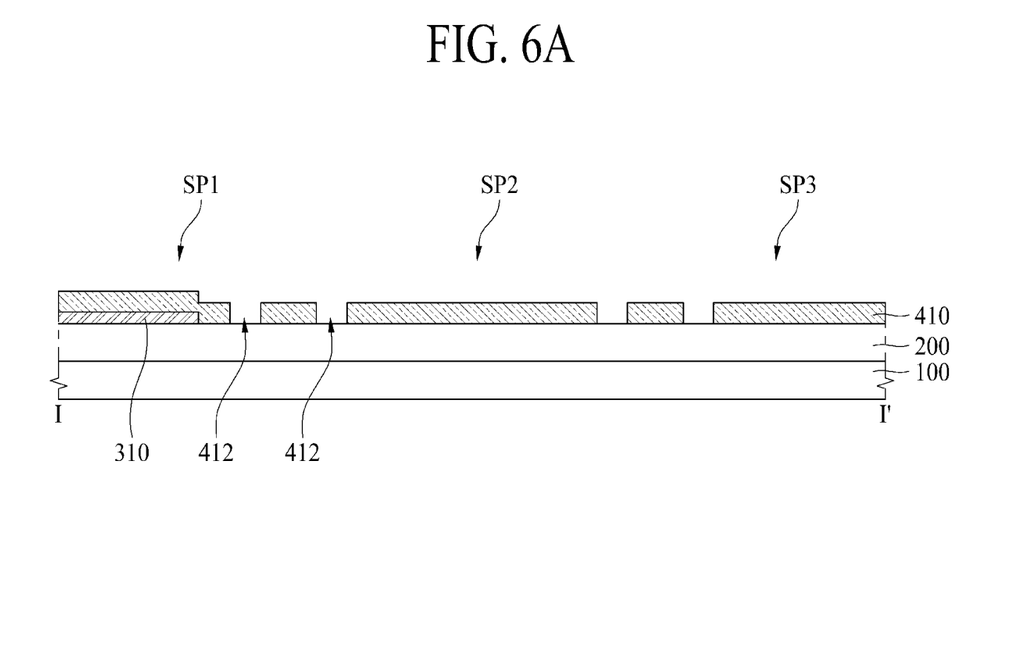
FIGS. 6A to 6E are schematic cross-sectional views illustrating a manufacturing process of an electroluminescent display device according to one aspect of the present disclosure.

As shown in FIG. 6A, a circuit element layer 200 is formed on a substrate 100, and a first reflective layer 310 is formed in the first subpixel SP1 on the circuit element layer 200.

After a first insulating layer 410 is formed on an entire surface of the substrate 100 including the first reflective layer 310, two second holes 412 spaced apart from each other while passing through the first insulating layer 410 are formed in boundary areas among the subpixels SP1, SP2 and SP3.

Figure 6B:
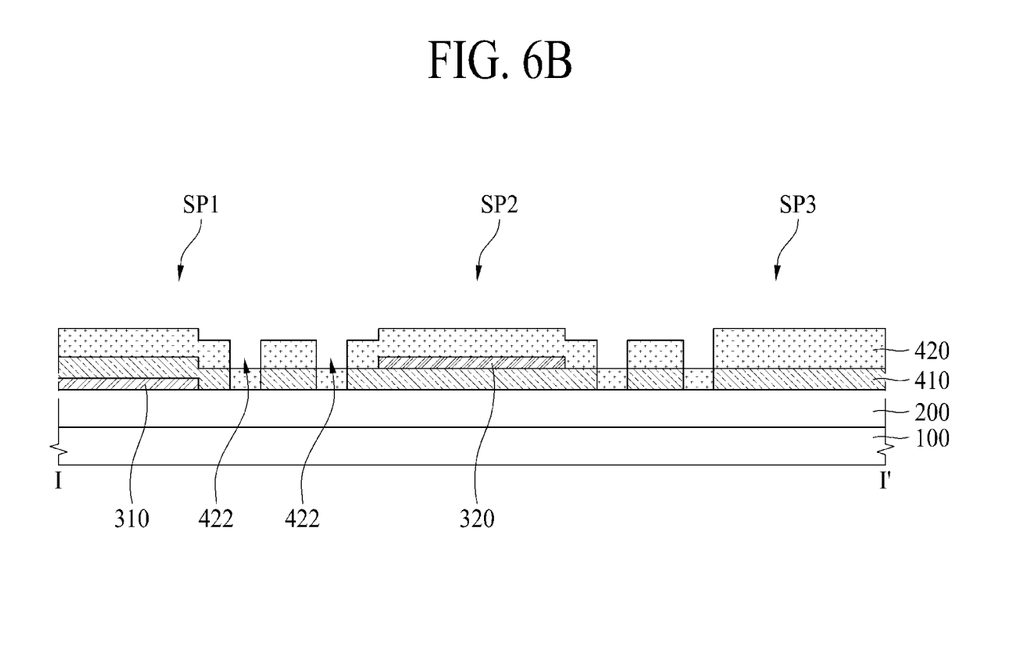

As shown in FIG. 6B, a second reflective layer 320 is formed in the second subpixel SP2 on the first insulating layer 410, and a second insulating layer 420 is formed on the entire surface of the substrate 100 including the second reflective layer 320.

Then, the second insulating layer 420 fills the two second holes 412 of the first insulating layer 410, and thus two second holes 422 of the second insulating layer 420 are provided over the second hole 412 area of the first insulating layer 410.

Figure 6C:
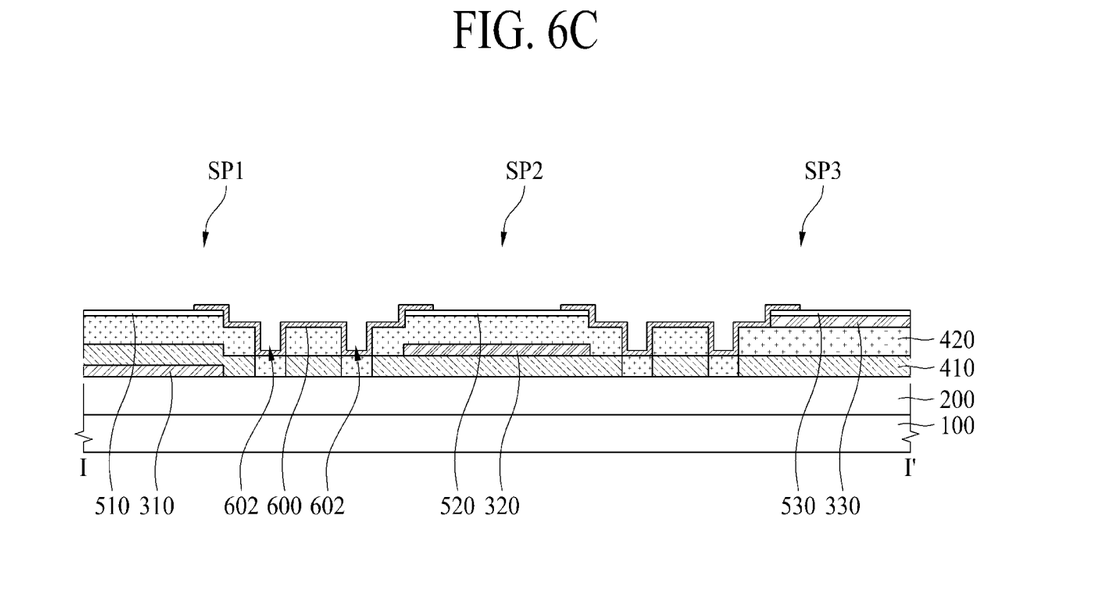

Next, as shown in FIG. 6C, first electrodes 510, 520 and 530 are formed on the second insulating layer 420 for each of the subpixels SP1, SP2 and SP3, and a fence structure 600 covering edges of the first electrodes 510, 520 and 530 is formed in the boundary areas among the subpixels SP1, SP2 and SP3.

As the fence structure 600 is formed on an inner surface of each of the two second holes 422 of the second insulating layer 420, two second holes 602 of the fence structure 600 are provided. Therefore, a second trench T2 formed of the second holes 602 of the fence structure 600 is formed.

Figure 6D:
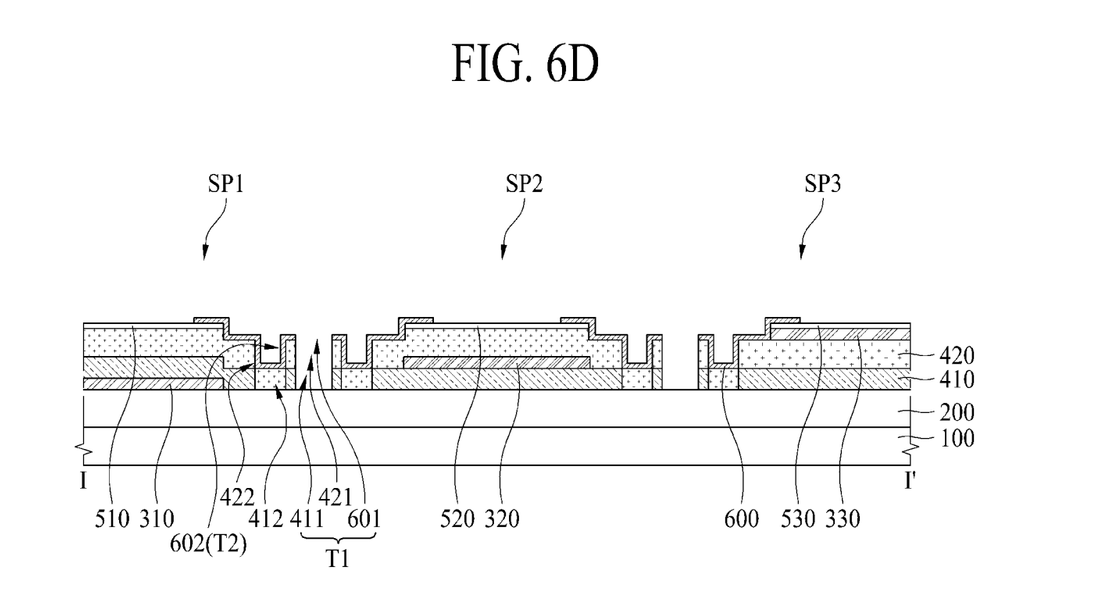

Next, as shown in FIG. 6D, a first hole 601 passing through the fence structure 600, a first hole 421 passing through the second insulating layer 420 and a first hole 411 passing through the first insulating layer 410 are formed in an area between the two second holes 602 of the fence structure 600. Therefore, a first trench T1 comprised of combination of the first hole 601 of the fence structure 600, the first hole 421 of the second insulating layer 420 and the first hole 411 of the first insulating layer 410 is formed. As the case may be, the first hole 411 of the first insulating layer 410 may not pass through the first insulating layer 410.

Figure 6E:
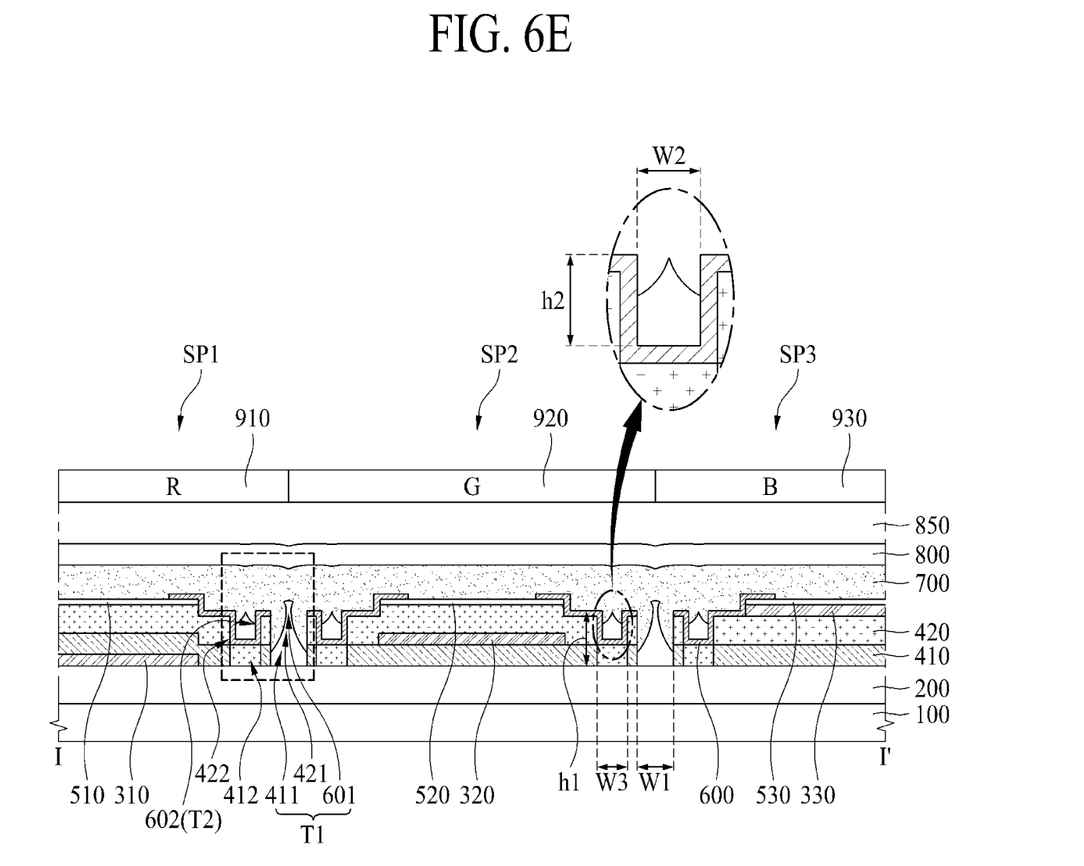

Next, as shown in FIG. 6E, a light emitting layer 700 is formed on the first electrodes 510, 520 and 530 and the fence structure 600 and in the first and second trenches T1 and T2, a second electrode 800 is formed on the light emitting layer 700, an encapsulation layer 850 is formed on the second electrode 800, and color filter layers 910, 920 and 930 are formed on the encapsulation layer 850.

The light emitting layer 700 may be formed in various ways as shown in FIGS. 3 to 5.

Figure 7:
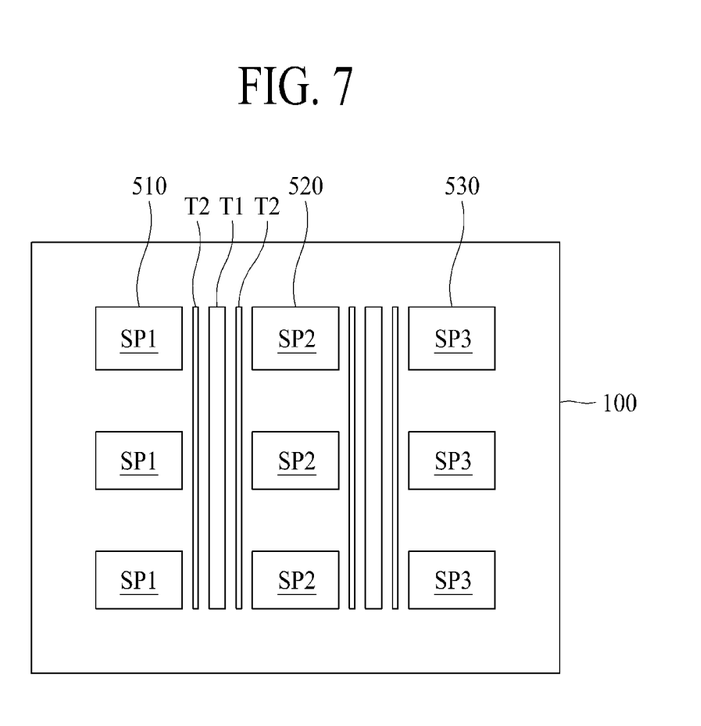
FIG. 7 is a schematic plan view illustrating an electroluminescent display device according to another aspect of the present disclosure.

FIG. 7 is a schematic plan view illustrating an electroluminescent display device according to another aspect of the present disclosure.

As noted from FIG. 7, the first subpixel SP1, the second subpixels SP2 and the third subpixels SP3 are sequentially arranged in a first direction, for example, a horizontal direction. Also, a plurality of first subpixels SP1 emitting light of the same color are arranged in a second direction, for example, a vertical direction, a plurality of second subpixels SP2 emitting light of the same color are arranged in the second direction, and a plurality of third subpixels SP3 emitting light of the same color are also arranged in the second direction.

The first electrodes 510, 520 and 530 are formed to be patterned in the first to third subpixels SP1, SP2 and SP3, respectively.

The first and second trenches T1 and T2 may be extended from a first side, for example, a lower side of the substrate 100 to a second side, for example, an upper side of the substrate 100 longitudinally in the second direction along a boundary area between the first subpixel SP1 and the second subpixel SP2 and a boundary area between the second subpixel SP2 and the third subpixel SP3. Therefore, the first and second trenches T1 and T2 may be formed in a stripe structure.

The first and second trenches T1 and T2 are not formed in a boundary area between the plurality of first subpixels SP1 emitting light of the same color, a boundary area between the plurality of second subpixels SP2 emitting light of the same color and a boundary area between the plurality of third subpixels SP3 emitting light of the same color.

Therefore, according to FIG. 7, charges may move between two adjacent first subpixels SP2, between two adjacent second subpixels SP2 and between two adjacent third subpixels SP3. However, in this case, there is no big problem in image quality because of the movement of charges among the subpixels SP1, SP2 and SP3 that emit light of the same color.

Figure 8:
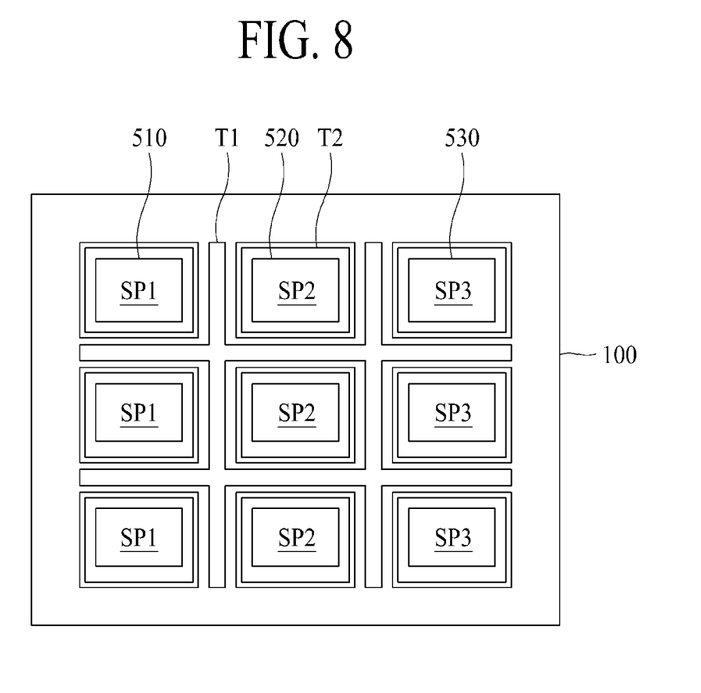
FIG. 8 is a schematic plan view illustrating an electroluminescent display device according to still another aspect of the present disclosure.

FIG. 8 is a schematic plan view illustrating an electroluminescent display device according to still another aspect of the present disclosure.

In FIG. 8, the first and second trenches T1 and T2 are additionally formed in the boundary area between the plurality of first subpixels SP1 emitting light of the same color, the boundary area between the plurality of second subpixels SP2 emitting light of the same color and the boundary area between the plurality of third subpixels SP3 emitting light of the same color in the structure of FIG. 7.

Referring to FIG. 8, the first trench T1 is longitudinally extended from the first side to the second side of the first substrate 100 in a second direction, for example, a vertical direction along boundary areas among the plurality of subpixels SP1, SP2 and SP3 that emit light of different colors, and is also longitudinally extended from a third side to a fourth side of the substrate 100 in a first direction, for example, a horizontal direction, along boundary areas among the plurality of subpixels SP1, SP2 and SP3 that emit light of the same color.

Therefore, the first trench T1 may be formed in a mesh structure in which the first trench T1 is formed in all boundary areas among the plurality of subpixels SP2, SP2 and SP3 such that the first trenches T1 are all connected with one another.

The second trench T2 is provided between the first trench T1 and the first electrode 510, 520 and 530. The second trench T2 has a shape corresponding to the first electrodes 510, 520 and 530 and surrounds the first electrodes 510, 520 and 530. Therefore, the plurality of second trenches T2 are not connected to each other and individually surround the first electrodes 510, 520 and 530.

Figure 9A:
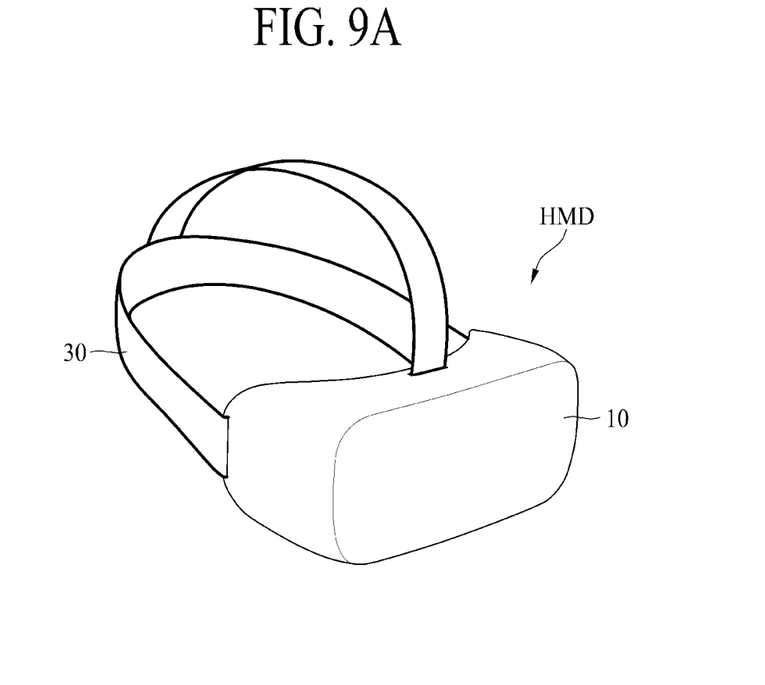
FIGS. 9A to 9C are views illustrating an electroluminescent display device according to still further another aspect of the present disclosure.
Figure 9B:
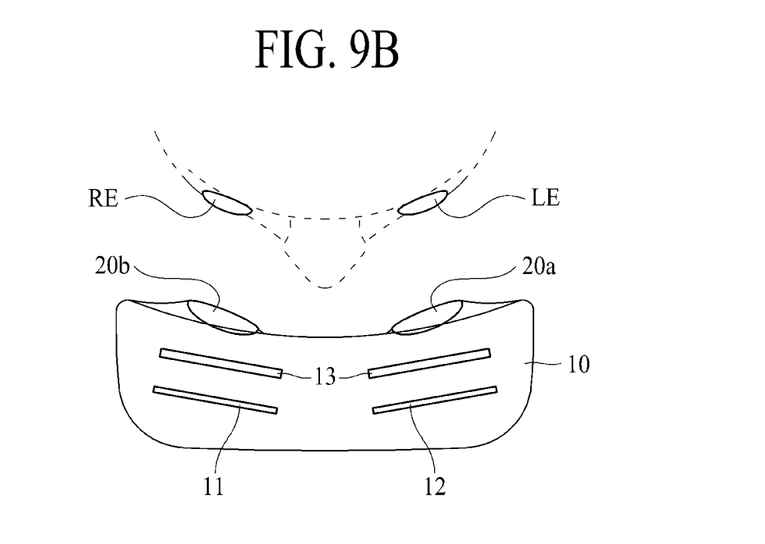
Figure 9C:
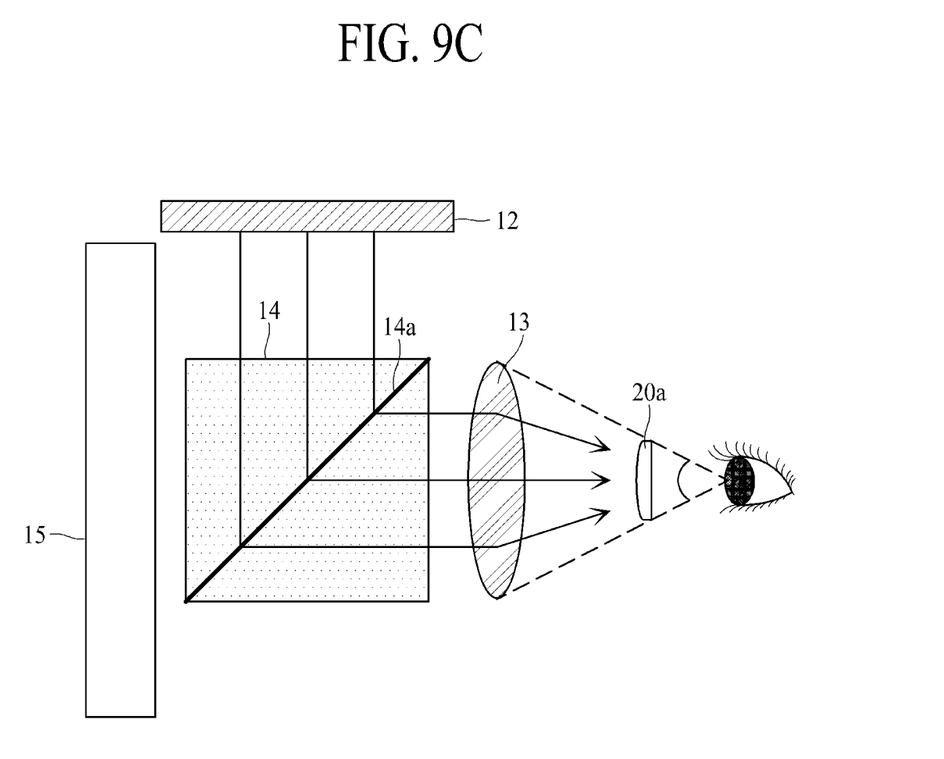

FIGS. 9A to 9C relate to an electroluminescent display apparatus according to another aspect of the present disclosure and relate to a head-mounted display (HMD) apparatus. FIG. 9A is a schematic perspective view, FIG. 9B is a schematic plan view of a virtual reality (VR) structure, and FIG. 9C is a schematic cross-sectional view of an augmented reality (AR) structure.

As seen in FIG. 9A, the HMD apparatus according to the present disclosure may include an accommodating case 10 and a head-mounted band 30.

The accommodating case 10 may accommodate elements such as a display apparatus, a lens array, and an eyepiece lens.

The head-mounted band 30 may be fixed to the accommodating case 10. The head-mounted band 30 is illustrated as being provided to surround an upper surface of both side surfaces of a user, but is not limited thereto. The head-mounted band 30 may fix the HMD apparatus to a head of a user and may be replaced by a glasses frame type structure or a helmet type structure.

As seen in FIG. 9B, an HMD apparatus having the VR structure according to the present disclosure may include a left-eye display apparatus 12, a right-eye display apparatus 11, a lens array 13, a left-eye eyepiece lens 20a, and a right-eye eyepiece lens 20b.

The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and in this case, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display apparatus as explained above. In this case, an upper portion corresponding to a surface displaying an image may face the lens array 13.

The lens array 13 may be spaced apart from each of the left-eye eyepiece lens 20a and the left-eye display apparatus 12 and may be provided between the left-eye eyepiece lens 20a and the left-eye display apparatus 12. That is, the lens array 13 may be disposed in front of the left-eye eyepiece lens 20a and behind the left-eye display apparatus 12. Also, the lens array 13 may be spaced apart from each of the right-eye eyepiece lens 20b and the right-eye display apparatus 11 and may be provided between the right-eye eyepiece lens 20b and the right-eye display apparatus 11. That is, the lens array 13 may be disposed in front of the right-eye eyepiece lens 20b and behind the right-eye display apparatus 11.

The lens array 13 may be a micro-lens array. The lens array 13 may be replaced by a pin hole array. By using the lens array 13, an image displayed by the left-eye display apparatus 12 or the right-eye display apparatus 11 may be zoomed in by a certain magnification, and thus, a zoomed-in image may be seen by a user.

A left eye LE of a user may be located at the left-eye eyepiece lens 20a, and a right eye RE of the user may be located at the right-eye eyepiece lens 20b.

As seen in FIG. 9C, an HMD apparatus having the AR structure according to the present disclosure may include a left-eye display apparatus 12, a lens array 13, a left-eye eyepiece lens 20a, a transmissive reflection part 14, and a transmissive window 15. In FIG. 9C, for convenience, only left-eye elements are illustrated, and right-eye elements may be the same as the left-eye elements.

The left-eye display apparatus 12, the lens array 13, the left-eye eyepiece lens 20a, the transmissive reflection part 14, and the transmissive window 15 may be accommodated into the accommodating case 10.

The left-eye display apparatus 12 may be disposed in one side (for example, an upper side) of the transmissive reflection part 14 without covering the transmissive window 15. Therefore, the left-eye display apparatus 12 may provide an image to the transmissive reflection part 14 without covering an external background seen through the transmissive window 15.

The left-eye display apparatus 12 may be configured as the electroluminescent display apparatus as explained above. In this case, an upper portion corresponding to a surface displaying an image may face the transmissive reflection part 14.

The lens array 13 may be provided between the left-eye eyepiece lens 20a and the transmissive reflection part 14.

The left eye of the user may be located at the left-eye eyepiece lens 20a.

The transmissive reflection part 14 may be disposed between the lens array 13 and the transmissive window 15. The transmissive reflection part 14 may include a reflection surface 14a which transmits a portion of light and reflects the other portion of the light. The reflection surface 14a may be provided so that an image displayed by the left-eye display apparatus 12 travels to the lens array 13. Accordingly, the user may see, through the transmissive window 15, all of the external background and the image displayed by the left-eye display apparatus 12. That is, the user may see one image which includes a real background and a virtual image, and thus, AR may be implemented.

The transmissive window 15 may be disposed in front of the transmissive reflection part 14.

According to the present disclosure, the following advantageous effects may be obtained.

According to one aspect of the present disclosure, as the trench is formed at the boundary between the subpixels, a portion of the light emitting layer in one subpixel and a portion of the light emitting layer in another subpixel adjacent thereto are disconnected from each other in the trench, whereby a leakage current may be prevented from occurring between the adjacent subpixels, and deterioration of image quality due to the leakage current may be avoided.

According to one aspect of the present disclosure, the hole injection layer of the first stack is provided to be discontinuous in the first and second trenches, whereby a leakage current may be prevented from occurring between the subpixels disposed to be adjacent to each other.

According to one aspect of the present disclosure, the charge generation layer is provided to be discontinuous in the first trench, whereby a leakage current may be prevented from occurring between the subpixels disposed to be adjacent to each other.

According to one aspect of the present disclosure, since the hole injection layer is discontinuous in the second trench, even though a short occurs between the charge generation layer and the hole injection layer in the first trench, the charge generation layer and the hole injection layer are not connected to each other in each subpixel, whereby desired light emission may be obtained in the light emitting layer.

According to one aspect of the present disclosure, since the first pore is extended from the inside of the first trench to the outside above the first trench, the first stack and the charge generation layer may be discontinuous in the first trench. Also, since the second pore is extended from the inside of the second trench to the outside above the second trench, the hole injection layer of the first stack may be discontinuous in the first trench.

It will be apparent to those skilled in the art that the present disclosure described above is not limited by the above-described aspects and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

The various aspects described above can be combined to provide further aspects. All of the patents, applications, and publications referred to in this specification and/or listed in the Application Data Sheet are incorporated herein by reference, in their entirety. Aspects of the aspects can be modified, if necessary to employ concepts of the various patents, applications and publications to provide yet further aspects.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled.

What is claimed is:

1. An electroluminescent display device comprising:
   a substrate having a first subpixel and a second subpixel, which are adjacent to each other;
   a first electrode provided in each of the first subpixel and the second subpixel;
   a trench including a first trench and a second trench, which are provided to be spaced apart from each other at a boundary between the first subpixel and the second subpixel;
   a light emitting layer provided on the first electrode of the first subpixel, the second subpixel and the boundary between the first subpixel and the second subpixel; and
   a second electrode provided on the light emitting layer,
   wherein a first portion of the light emitting layer is discontinuous in the first trench and the second trench, a second portion of the light emitting layer is discontinuous in the first trench and is continuous in an area overlapping with the second trench, and a third portion of the light emitting layer is continuous in an area overlapping with the first trench and the second trench.

2. The electroluminescent display device of claim 1, wherein the second trench is disposed between the first trench and the first electrode.

3. The electroluminescent display device of claim 1, wherein a width of the first trench is wider than that of the second trench, and a depth of the first trench is deeper than that of the second trench.

4. The electroluminescent display device of claim 1, further comprising a first insulating layer disposed below the light emitting layer at the boundary between the first subpixel and the second subpixel, a second insulating layer disposed on the first insulating layer, and a fence structure disposed on the second insulating layer and covering an edge of the first electrode,
   wherein the first trench is provided by combination of a first hole in the first insulating layer, a first hole in the second insulating layer and a first hole in the fence structure, and
   wherein the second trench is provided by a second hole in the fence structure.

5. The electroluminescent display device of claim 4, wherein the first hole provided in the fence structure has a same width as that of each of the first hole provided in the first insulating layer and the first hole provided in the second insulating layer, and overlaps and connected with each other.

6. The electroluminescent display device of claim 4, wherein each of the first insulating layer and the second insulating layer further includes a second hole overlapping with the second hole of the fence structure, the second hole of the fence structure is disconnected with the second hole of the first insulating layer and the second hole of the second insulating layer, and
   a width of the second hole of the fence structure is narrower than a width of the second hole of the first insulating layer and a width of the second hole of the second insulating layer.

7. The electroluminescent display device of claim 4, further comprising a first reflective layer disposed below the first insulating layer in the first subpixel and a second reflective layer disposed on the first insulating layer in the second subpixel.

8. The electroluminescent display device of claim 1, wherein the light emitting layer includes a first stack including a hole injection layer, a charge generation layer provided on the first stack, and a second stack provided on the charge generation layer,
   the first portion of the light emitting layer includes the hole injection layer,
   the second portion of the light emitting layer includes the charge generation layer, and
   the third portion of the light emitting layer includes at least a portion of the second stack.

9. The electroluminescent display device of claim 8, wherein the first stack further includes a hole transport layer provided on the hole injection layer and a first organic light emitting layer provided on the hole transport layer, and
   the first portion of the light emitting layer further includes the hole transport layer or the hole transport layer and the first organic light emitting layer.

10. The electroluminescent display device of claim 8, wherein the charge generation layer is connected with the hole injection layer in the first trench, and is disconnected with the hole injection layer in the second trench.

11. The electroluminescent display device of claim 1, further comprising a first pore provided in the first trench and a second pore provided in the second trench,
   wherein the first pore is extended from inside of the first trench to outside above the first trench and the second pore is extended from inside of the second trench to outside above the second trench, and
   wherein the first pore is greater than the second pore.

12. The electroluminescent display device of claim 1, further comprising a lens array spaced apart from the substrate, and a storage case for storing the substrate and the lens array.

13. An electroluminescent display device comprising:
   a substrate having a first subpixel, a second subpixel and a third subpixel, which are arranged in a first direction;
   a first electrode provided in each of the first subpixel, the second subpixel and the third subpixel on the substrate;
   a fence structure provided to cover an edge of the first electrode;
   an insulating layer under the fence structure;
   a trench including a first trench and a second trench, which are respectively provided in a boundary area between the first subpixel and the second subpixel and a boundary area between the second subpixel and the third subpixel;
   a light emitting layer provided on the first electrode and provided in the trench; and
   a second electrode provided on the light emitting layer,
   wherein a first portion of the light emitting layer is discontinuous in the first trench, a second portion of the light emitting layer is discontinuous in the second trench, wherein the first trench and the second trench have different physical characteristics that cause the first portion and the second portion to have different thicknesses, and wherein the first trench is provided by combination of a hole in the insulating layer and a hole in the fence structure, and the second trench is provided in the fence structure.

14. The electroluminescent display device of claim 13, wherein the light emitting layer includes a first stack including a hole injection layer, a charge generation layer provided on the first stack, and a second stack provided on the charge generation layer, wherein the hole injection layer is discontinuous in the first trench and the second trench, and wherein the charge generation layer is discontinuous in the first trench, and is continuous in an area overlapping with the second trench.

15. The electroluminescent display device of claim 14, wherein the charge generation layer is connected with the hole injection layer in the first trench.

16. The electroluminescent display device of claim 14, wherein the substrate further includes another first subpixel which is adjacent to the first subpixel in a second direction and emits light of a same color, another second subpixel which is adjacent to the second subpixel in the second direction and emits light of the same color, and another third subpixel which is adjacent to the third subpixel in the second direction and emits light of the same color, and wherein the first trench is further provided in a boundary area between the another first subpixel and the another second subpixel and a boundary area between the another second subpixel and the another third subpixel, and is extended from a first side to a second side of the substrate.

17. The electroluminescent display device of claim 16, wherein the first trench is further provided in a boundary area between the first subpixel and the another first subpixel, a boundary area between the second subpixel and the another second subpixel and a boundary area between the third subpixel and the another third subpixel, and is extended from a third side to a fourth side of the substrate, and wherein the second trench is provided to surround the first electrode between the first electrode and the first trench.

18. The electroluminescent display device of claim 13, further comprising a lens array spaced apart from the substrate, and a storage case for storing the substrate and the lens array.

19. An electroluminescent display device comprising:
a first subpixel and a second subpixel, which are adjacent to each other;
a first electrode disposed in each of the first subpixel and the second subpixel;
a first trench and a second trench spaced apart from each other at a boundary between the first and second subpixels;
a fence structure disposed in the second trench and covering an edge of the first electrode of the first subpixel,
a light emitting layer including a first portion disconnected in the first trench and the second trench, a second portion disconnected in the first trench and connected in an area overlapping with the second trench, and a third portion connected in an area overlapping with the first trench and the second trench; and
a second electrode disposed on the light emitting layer.

20. The electroluminescent display device of claim 19, further comprising a first pore disposed in the first trench and a second pore disposed in the second trench, wherein the first pore is extended from inside of the first trench to outside above the first trench and the second pore is extended from inside of the second trench to outside above the second trench, and wherein the first pore is greater than the second pore.

* * * * *